United States Patent [19]
Gerner

[11] Patent Number: 5,429,954
[45] Date of Patent: Jul. 4, 1995

[54] RADIATION-EMITTING DIODE WITH IMPROVED RADIATION OUTPUT

[75] Inventor: Jochen Gerner, Wiesloch, Germany

[73] Assignee: Temic Telefunken microelectronic GmbH, Heilbronn, Germany

[21] Appl. No.: 148,856

[22] Filed: Nov. 8, 1993

[30] Foreign Application Priority Data

Feb. 20, 1993 [DE] Germany .................. 43 05 296.7

[51] Int. Cl.⁶ .......................................... H01L 21/265
[52] U.S. Cl. ........................ 437/23; 437/205; 437/209; 437/905; 437/977; 257/13
[58] Field of Search ............... 437/209, 23, 977, 207, 437/208, 247, 904, 905, 906; 148/DIG. 138, DIG. 99, DIG. 80; 257/620, 623, 625, 626, 13, 14

[56] References Cited

U.S. PATENT DOCUMENTS

| | | | |
|---|---|---|---|
| 3,701,696 | 10/1972 | Mets | 437/977 |
| 3,918,150 | 11/1975 | Gantley | 437/977 |
| 5,040,044 | 8/1991 | Noguchi et al. | |
| 5,172,195 | 12/1992 | Sekiwa | |
| 5,250,466 | 10/1993 | Gerner et al. | 437/247 |
| 5,284,781 | 2/1994 | Satyanarayan et al. | 437/23 |
| 5,300,788 | 4/1994 | Fan et al. | 257/13 |

FOREIGN PATENT DOCUMENTS

| | | |
|---|---|---|
| 2719567 | 12/1977 | Germany . |
| 61-183977 | 8/1986 | Japan | 437/23 |

OTHER PUBLICATIONS

Shioya, Y.; Maeda, M.: Comparison of Phosphosilicate Glass Films Deposited by Three Different Chemical Vapor Deposition Methods. In: J. Electrochem. Soc.: Solid-State Science and Technology, Sep. 1986, vol. 133, pp. 1943–1950.

Freeouf, J. L. et al.: Accumulation capacitance for GaAs-SiO₂ interfaces with Si interlayers. In: Appl. Phys. Lett. 57, 18, Oct. 29, 1990, pp. 1919–1921.

IEEE Transaction on Semiconductor Manufacturing, vol. 4, No. 1, Feb. 1991, pp. 66–68.

*Primary Examiner*—Kevin M. Picardat
*Attorney, Agent, or Firm*—Spencer, Frank & Schneider

[57] ABSTRACT

A method for manufacture of radiation-emitting diodes includes manufacturing a layer sequence containing a radiation-generating pn-junction on a substrate wafer manufacturing contact layers for electrical connections on an upper face of the layer sequence and on an underside of the substrate wafer, etching trenches defining the size and shape of the area of individual pn-junctions of individual diodes being manufactured, providing a protective layer extending over the upper face contact layers and the etched trenches, subdividing the wafer having the layer sequence, the contact layers, and the protective layer thereon into individual diodes having lateral faces, after the subdividing, etching the lateral faces which are not provided with the protective layer to make the lateral faces into rough surfaces, and removing the protective layer following etching of the lateral faces.

16 Claims, 2 Drawing Sheets

RADIATION-EMITTING DIODE WITH IMPROVED RADIATION OUTPUT

BACKGROUND OF THE INVENTION

The invention relates to a radiation-emitting diode with improved radiation output, and to a method for manufacture thereof. In particular, the invention relates to an infrared diode with a surface toughened to improve the radiation emission.

Infrared-emitting diodes of silicon-doped gallium arsenide are used on a large scale today as transmitters for a wide variety of remote control applications. To ensure high functional reliability and a low power requirement, as great as possible an external quantum efficiency is required from the diodes.

The external quantum efficiency of a light-emitting diode is determined both by the internal quantum efficiency and by the losses occurring when radiation leaves the interior of the diode. One of the main causes for such losses is the radiation proportion resulting from the high optical refraction coefficient of the semiconductor material—about 3.6 for gallium arsenide—that cannot be emitted at the semiconductor surface on account of total reflection. In the case of gallium arsenide, a critical angle for the total reflection of 16.2° results at the transition to air. By the direct path, only the proportion of radiation that hits the boundary surface below a lower angle to the surface normal is emitted. This radiation proportion is however still subject to a partial reflection caused by the abrupt change in the refraction coefficient. For radiation hitting the boundary surface vertically, the transmission coefficient is about 68%, so that if the absorption of the radiation on the way to the boundary surface is ignored, only about 2.7% of the generated radiation can leave the semiconductor crystal on a direct path in the case of a flat structure.

The radiation emission from the interior of the diode can be improved by various measures, such as application of a $\lambda/4$ thick coating, covering with a material adapted to the refraction coefficient, roughening of the diode surface, or a combination of the above measures.

From EP 404 565 (U.S. Pat No. 5,040,044), a radiation-emitting diode made from a III-V compound semiconductor material is known in which the entire surface of the semiconductor chip is roughened in order to improve the external quantum efficiency. Roughening prevents total reflection of the generated radiation at the boundary layer between the diode chip and the surrounded material, shortens the light travel distance inside the semiconductor material, and hence reduces the probability of reabsorption. However, a drawback of a semiconductor chip surface roughened in this way is that the etched contact surface makes the chip very difficult to bond. In addition, etching of the surface in the vicinity of the radiation-emitting pn-junction leads to reduced service lives of the diodes.

SUMMARY OF THE INVENTION

The object underlying the invention is therefore to provide a radiation-emitting diode in which the total reflection is reduced, which can be bonded easily, and in which there is no reduction of the service life. This object is attained with a radiation-emitting diode having only lateral surfaces thereof substantially roughened.

A further object of the invention is to provide a method for manufacture of a radiation-emitting diode.

This object is attained by a method for manufacture of radiation-emitting diodes, including manufacturing a layer sequence containing a radiation-generating pn-junction on a substrate wafer manufacturing contact layers for electrical connections on an upper face of the layer sequence and on an underside of the substrate wafer, etching trenches defining the size and shape of the area of individual pn-junctions of individual diodes being manufactured, providing a protective layer extending over the upper face contact layers and the etched trenches, subdividing the wafer having the layer sequence, the contact layers, and the protective layer thereon into individual diodes having lateral faces, after the subdividing, etching the lateral faces which are not provided with the protective layer to make the lateral faces into rough surfaces, and removing the protective layer following etching of the lateral faces. The advantageous embodiment of the invention is in accordance with the features of the dependent claims.

In a radiation-emitting diode, an epitaxial layer sequence of the mesa type is provided on a substrate wafer. The epitaxial layer sequence contains the radiation-generating pn-junction. For better radiation emission, the surface of the diode element is roughened by etching. It is provided in accordance with the invention that the roughening of the surface is substantially restricted to the vicinity of the substrate wafer. In any event, the area of contact metallization and the area at which the pn-junction is on the surface must be excluded from roughening. This measure improves the radiation emission compared with diodes with unetched surface, but without impairing the wire-bonding capability or the service life of the diode.

Roughening of the surface can be applied to particular advantage in diodes whose substrate wafer and epitaxial layers consist of a compound semiconductor material. Generally speaking, III-V compound semiconductors are used for radiation-emitting diodes, such as GaAs or GaAlAs for infrared-emitting diodes. It is not however necessary for the substrate wafer and the epitaxial layers to consist of the same compound semiconductor material.

The method in accordance with the invention for manufacture of a radiation-emitting diode with the surface roughened as previously described entails the following steps: first a layer sequence that contains the pn-junction is provided on a substrate wafer. This is achieved by suitable and known methods of epitaxy, for example liquid phase or gas phase epitaxy. After manufacture of the active layers, the contact layers are generated on the upper face and on the rear face of the substrate wafer. The contact layers are matched to the respective semiconductor material of the layer sequence or of the substrate wafer, and can have simple metallic layers or complicated structures with different material compositions. Manufacture of the contact layers also includes structuring of the contact electrodes to reduce the obscuration of the pn-junction.

In a following process step, trenches are etched into the layer sequence containing the pn-junction and into part of the substrate wafer in order to define the size and the area of the various diodes.

Before the substrate wafer is now subdivided along the trenches, the surface of the wafer is provided with a protective layer. This protective layer in an embodiment of the method is silicon dioxide, which can be applied to the surface using a CVD process, for example. The protective layer substantially covers the surface of the wafer formed by the mesa-type slopes and the upper face contacts.

After subdivision of the substrate wafer along the trenches, the lateral faces exposed by the subdivision process and not provided with the protective layer are etched. This etching process roughens the surface, thereby reducing the total reflection at these surfaces. In an advantageous embodiment of the method in accordance with the invention, the silicon dioxide protective layer is provided using a thermal CVD process, in which silane SiH4 and oxygen O2 are used as the basic substances.

In a further embodiment, the silicon dioxide protective layer is provided using a plasma-enhanced CVD process, in which silane SiH4 and nitrous oxide N2O are used as basic substances. Deposition takes place at a temperature between 250° C. and 350° C.

It has proved particularly advantageous for the silicon dioxide layer to have a thickness between 150 and 1500 nm.

Etching of the lateral faces takes place, in accordance with an advantageous embodiment of the invention, in an etching solution comprising a 65% by weight nitric acid. Etching takes place at room temperature.

The lateral faces can also be etched in a dry-etching process.

In an advantageous embodiment of the method, the diodes are affixed during the etching process with the substrate underside onto a carrier foil. Affixing of the diodes to the carrier foil takes place before the subdivision of the substrate wafer.

After etching of the lateral faces, the protective layer is removed. This is achieved in a further etching process.

DESCRIPTION OF THE PREFERRED EMBODIMENTS

The following illustrates an embodiment of the invention on the basis of the Figures.

Figure 1:
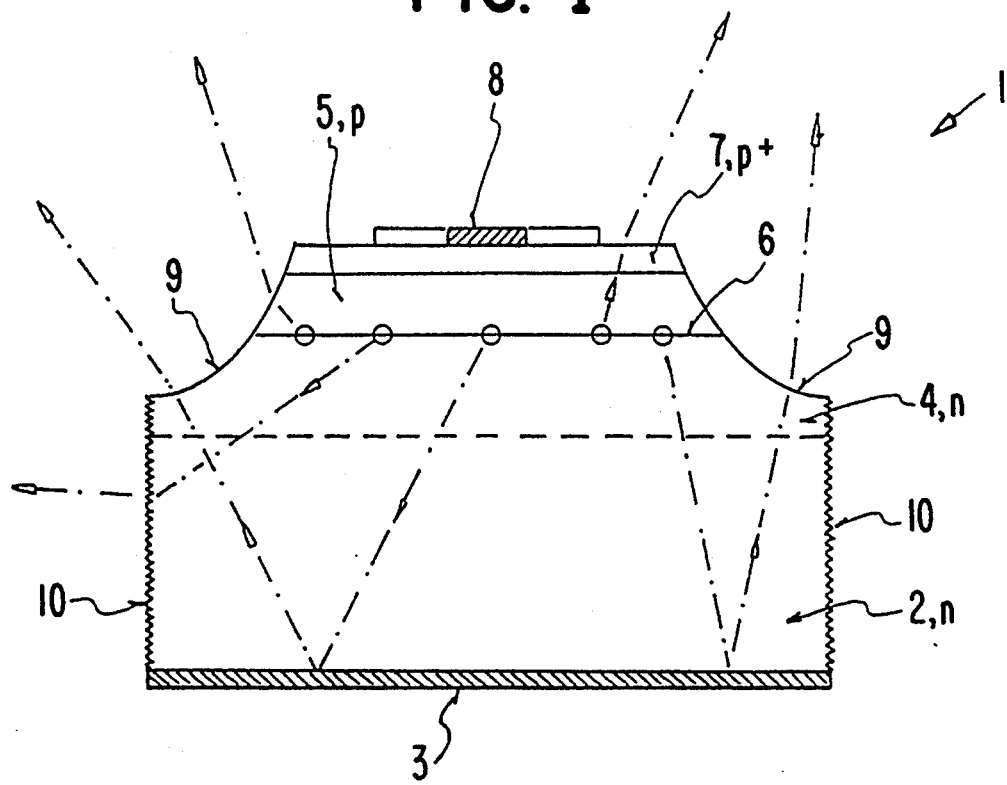
FIG. 1 shows a cross-section through an infrared-emitting diode of the GaAs:Si type with the rough-etched lateral faces.

FIG. 1 shows a cross-section through an infrared-emitting diode 1 of the GaAs:Si type with rough-etched lateral faces. The diode illustrated is a mesa-type diode. An n-conductive substrate 2 made of the compound semiconductor GaAs has grown onto it, using a silicon-doped melt, first an n-conductive GaAs layer 4 and then a p-conductive GaAs layer 5. The surface conductivity of the p-conductive layer 5 is then increased by a zinc diffusion in order to obtain the current propagation layer 7. On the p-side of the diode, a tempered and structured aluminum conducting path 8 is used for contacting. On the n-side, a full-surface gold:germanium contact 3 is provided. The active surface of the pn-junction 6 through which the current flows is determined by etching of trenches or mesa slopes 9.

The infrared light is generated in a plane defined by the pn-junction 6. The photon energy is less than the band gap Egap on account of the involvement of deep acceptor states during recombination. The result is that volume absorption in the n-region is low. Volume absorption in the highly compensated p-region and in the highly doped p+ current propagation zone above is by contrast so high that only a small proportion of the total radiation can leave the diode through the p-conducting top surface. Given this peculiarity of the infrared emitter diodes of GaAs:Si, it is sufficient to rough-etch only the lateral faces 10 of the diode 1. The aluminum conducting path can be protected from attack by the etching solution here. This ensures a flawless wire bonding capability of the aluminum conducting path 8.

FIGS. 2a to 2d show a cross-section through the semiconductor array after the substantial process steps of the method for roughening the lateral faces of infrared-emitting diodes. First the epitaxial layers 4, 5 and 7 are deposited on the substrate wafer 2. These layers contain the radiation-generating pn-junction. On the upper face, a structured aluminum conducting path 8 is deposited for contacting. The rear face of the substrate wafer is provided with a full-surface gold:germanium contact 3. Trenches 9 are etched onto the surface of the array and extend from the surface of the epitaxial layers 4, 5 and 7 to the substrate wafer 2. The trenches 9 limit the area of the radiation-emitting pn-junction and determine the size of the individual diode.

Figure 2A:
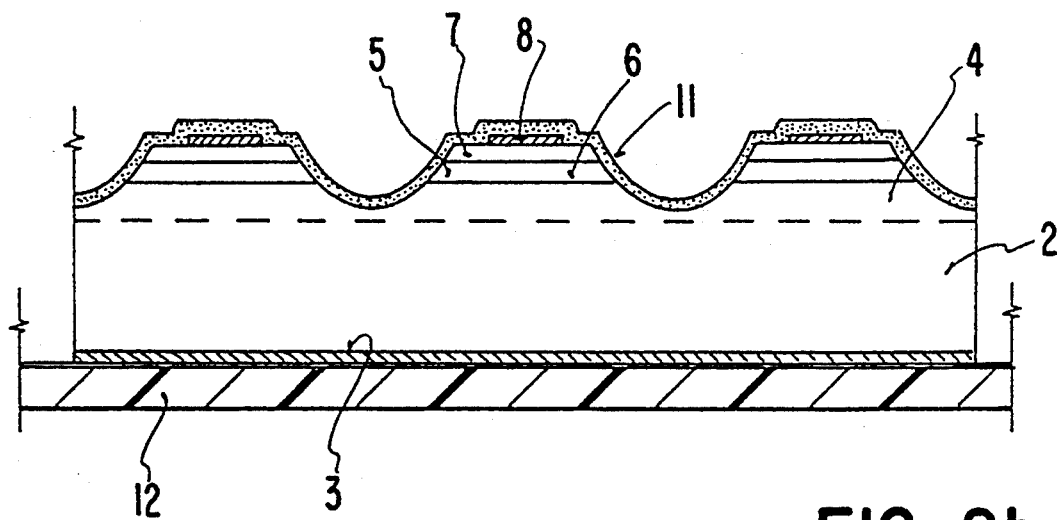
FIGS. 2a–2c show the substrate wafer with the epitaxial layers at different times during the manufacturing process.
Figure 2B:
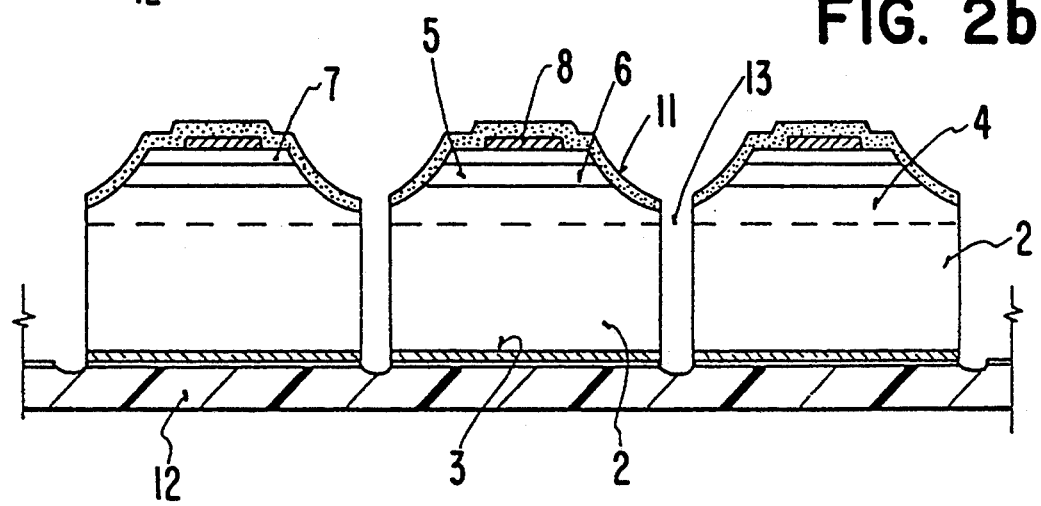

A silicon dioxide layer with a thickness between 150 and 1500 nm is formed on the surface of the semiconductor array thereby obtained. The silicon dioxide layer 11 is made by, for example, thermal chemical vapor deposition with silane SiH4 and oxygen O2 at a temperature of around 360° C., or by plasma-enhanced chemical vapor deposition with silane SiH4 and nitrous oxide N2O at a temperature of between 250° C. and 350° C. The layers generated in this way adhere well to the semiconductor material underneath, so that no disturbing oxide flakes come away during subsequent separation of the diodes (FIG. 2a). Then a carrier foil is affixed to the rear face of the substrate wafer and the diodes are separated by sawing. The sawing cut 13 is along the valley bottoms of the trenches 9, and extends from the surface of the silicon dioxide top layer through the semiconductor element down to the carrier foil 12. The carrier foil 12 is not cut through, in order for the subdivided individual diodes to retain their handling property. This process step is shown in FIG. 2b.

Figure 2C:
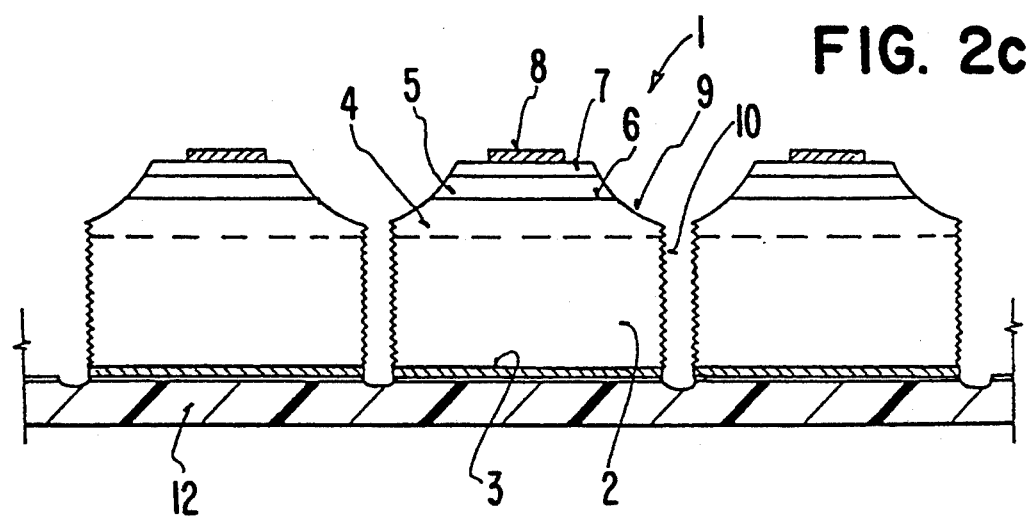

In the next step of the process, the unprotected lateral faces 10 of the diodes affixed to the carrier foil 12 are roughened by a wet-chemical etching operation. Roughening is achieved by an etching process with nitric acid HNO3 (65% by weight) lasting about 10 seconds at room temperature. This etching process has no harmful effect either on the foil adhesive or on the carrier foil itself. Finally, the silicon dioxide layer 11, which protected the surface and the mesa slopes from attack by the etching solution, is removed with buffered hydrofluoric acid in a further production step. The array thereby obtained is shown in FIG. 2c.

Figure 3:
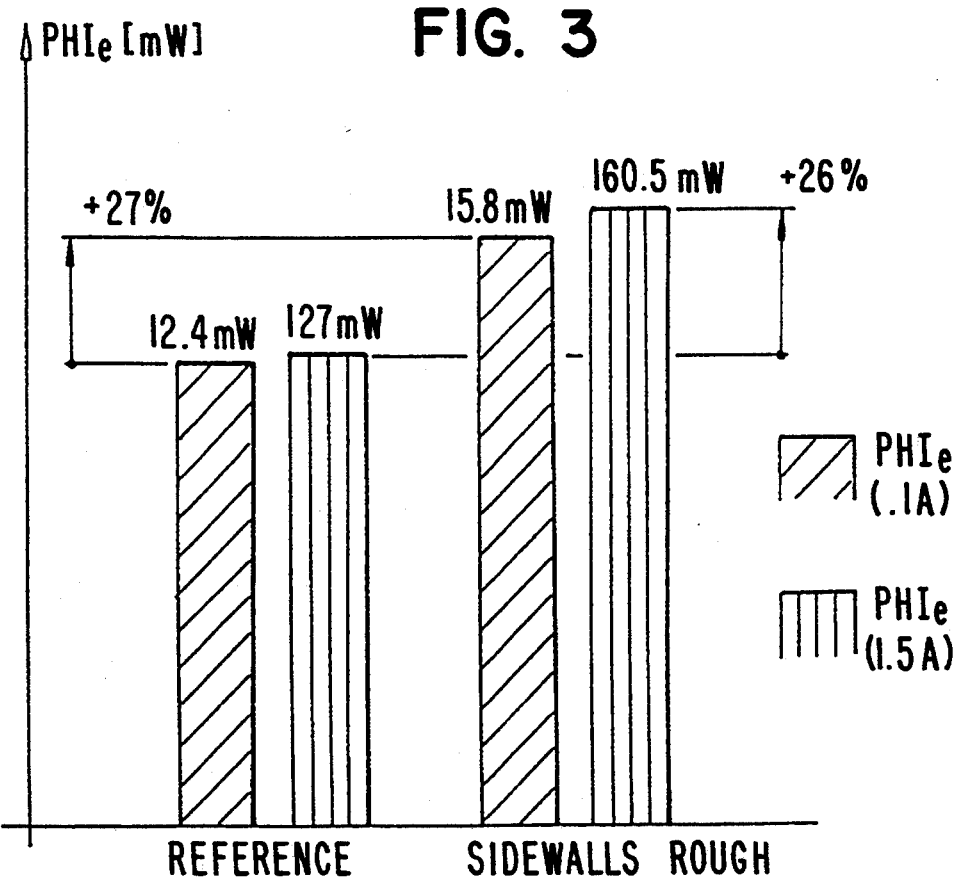
FIG. 3 shows the radiation output at 100 mA and 1.5 A forward current for conventional diodes and for diodes with rough-etched lateral faces.

By rough-etching of the diode lateral faces, the external quantum efficiency can be increased by about 25%. This is shown by the diagram in FIG. 3, where the radiation output data of a conventional GaAs:Si infrared emitter diode at 100 mA and 1.5 A forward current are compared with those of a diode with rough-etched lateral faces. The radiation output at 100 mA was improved by 27%, from 12.4 mW to 15.8 mW. Tests have furthermore shown that the service life of diodes with etched lateral faces is not impaired in comparison with conventional diodes.

The method described above for roughening the lateral faces of radiation-emitting diodes permits an approximately 25% rise in the radiation output of the diodes. Since the surface contacts are protected during rough-etching, the wire bonding capability of the diode is preserved. Since rough-etching of the surface is furthermore confined to the lateral faces of the diodes, the service lives of the diodes are not affected by the process.

What is claimed is:

1. A method for manufacture of radiation-emitting diodes, comprising:
   manufacturing a layer sequence containing a radiation-generating pn-junction on a substrate wafer;
   manufacturing contact layers for electrical connections on an upper face of said layer sequence and on an underside of said substrate wafer;
   etching trenches defining the size and shape of the area of individual pn-junctions of individual diodes being manufactured;
   providing protective layer extending over said upper face contact layers and said etched trenches;
   subdividing said wafer having said layer sequence, said contact layers, and said protective layer thereon into individual diodes having lateral faces;
   after said subdividing, etching only said lateral faces which are not provided with said protective layer to make said lateral faces into rough surfaces; and
   removing said protective layer following etching of said lateral faces.

2. A method according to claim 1, wherein said substrate wafer and said layer sequence containing said pn-junction consist of a III-V compound semiconductor material.

3. A method according to claim 1, wherein said protective layer consists of silicon dioxide.

4. A method according to claim 3, wherein said step of providing a silicon dioxide protective layer comprises providing said silicon dioxide protective layer by chemical vapor deposition.

5. A method according to claim 4, wherein said chemical vapor deposition of said silicon dioxide protective layer comprises thermal chemical vapor deposition with silane SiH4 and oxygen O2 as basic substances.

6. A method according to claim 3, wherein said step of providing a silicon dioxide protective layer comprises providing said silicon dioxide protective layer by plasma-enhanced chemical vapor deposition with silane SiH4 and nitrous oxide N2O as basic substances at a temperature of between 250° C. and 350° C.

7. A method according to claim 6, wherein said silicon dioxide protective layer is deposited with a thickness of between 150 and 1500 nm.

8. A method according to claim 1, wherein said step of etching of said lateral faces is provided in an etching solution comprising 65% nitric acid HNO3 at room temperature.

9. A method according to claim 1, wherein said step of etching of said lateral faces comprises performing a dry etching process.

10. A method according to claim 1, further comprising during said step of etching of said lateral faces, affixing said contact layer on said underside of said substrate wafer onto a carrier foil.

11. A method according to claim 10, wherein said step of affixing to said carrier foil is performed prior to said step of subdividing.

12. A method according to claim 8, further comprising during said step of etching of said lateral faces, affixing said contact layer on said underside of said substrate wafer onto a carrier foil.

13. A method according to claim 12, wherein said step of affixing to said carrier foil is performed prior to said step of subdividing.

14. A method according to claim 13, wherein said step of removing said protective layer is performed following said step of etching of said lateral faces.

15. A method according to claim 9, further comprising during said step of etching of said lateral faces, affixing said contact layer on said underside of said substrate wafer onto a carrier foil.

16. A method according to claim 15, wherein said step of affixing to said carrier foil is performed prior to said step of subdividing.

* * * * *